US011304071B2

(12) United States Patent
Cookman et al.

(10) Patent No.: US 11,304,071 B2
(45) Date of Patent: Apr. 12, 2022

(54) RADIO CONTROL BASED ON OPERATIONAL PERFORMANCE FEEDBACK

(71) Applicant: QUALCOMM Incorporated, San Diego, CA (US)

(72) Inventors: Jordan Cookman, San Jose, CA (US); Jie Wu, San Diego, CA (US); David Loweth Winslow, San Diego, CA (US); Daniel Filipovic, Solana Beach, CA (US); Liang Zhao, Saratoga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/139,128

(22) Filed: Sep. 24, 2018

(65) Prior Publication Data

US 2020/0100121 A1    Mar. 26, 2020

(51) Int. Cl.
*H04B 1/04* (2006.01)
*H03H 7/38* (2006.01)
*H04W 24/02* (2009.01)
*H04W 4/029* (2018.01)

(52) U.S. Cl.
CPC ........... *H04W 24/02* (2013.01); *H04W 4/029* (2018.02)

(58) Field of Classification Search
None
See application file for complete search history.

(56) References Cited

U.S. PATENT DOCUMENTS

| | | | | |
|---|---|---|---|---|
| 6,993,297 B2* | 1/2006 | Smith, Jr. | ................ | H03H 7/40 455/121 |
| 8,265,571 B2* | 9/2012 | Adler | ..................... | H04B 1/406 455/83 |
| 8,712,355 B2* | 4/2014 | Black | ...................... | H04B 1/18 455/193.1 |
| 9,263,806 B2* | 2/2016 | Manssen | ................ | H04B 17/12 |
| 9,444,425 B2* | 9/2016 | Mow | ..................... | H04B 17/29 |
| 9,853,802 B2* | 12/2017 | Li | ............................. | H04B 1/18 |

(Continued)

FOREIGN PATENT DOCUMENTS

JP  2014154893 A  8/2014

OTHER PUBLICATIONS

International Search Report and Written Opinion—PCT/US2019/051852—ISA/EPO—Nov. 18, 2019.

*Primary Examiner* — Tuan A Tran
(74) *Attorney, Agent, or Firm* — Qualcomm Incoporated

(57) ABSTRACT

A wireless communication system includes: a first sub-system including a first radio and a second radio, each including a transceiver or a receiver; and a second sub-system coupled to the first sub-system and including: a first antenna configured to convey signals; a first tuner coupled to the first antenna; and a controller coupled to the first tuner, the controller being configured to cause the first tuner to adjust a characteristic of the first tuner; where the controller and/or the first tuner is configured to provide, to the first sub-system, an indication of an effect on operational performance of a portion of the second sub-system coupled to the second radio based on operation of the first tuner or the first antenna, or a combination thereof; where the first sub-system is configured to modify operation of the second radio based on the indication of the effect on operational performance.

24 Claims, 5 Drawing Sheets

(56) References Cited

U.S. PATENT DOCUMENTS

| | | | |
|---|---|---|---|
| 10,404,295 B2* | 9/2019 | Greene | H03F 3/24 |
| 10,420,023 B2* | 9/2019 | Ramasamy | H04B 17/318 |
| 10,498,012 B2* | 12/2019 | Judkins | H04B 1/18 |
| 10,536,943 B2* | 1/2020 | Greene | H04B 1/0458 |
| 2009/0231220 A1 | 9/2009 | Zhang et al. | |
| 2010/0317297 A1* | 12/2010 | Kratochwil | H04B 17/102 |
| | | | 455/67.11 |
| 2010/0323635 A1 | 12/2010 | Steeper et al. | |
| 2011/0105023 A1* | 5/2011 | Scheer | H01Q 1/242 |
| | | | 455/41.2 |
| 2011/0116569 A1 | 5/2011 | Vaughan et al. | |
| 2011/0117863 A1* | 5/2011 | Camp, Jr | H04B 1/18 |
| | | | 455/77 |
| 2013/0027129 A1* | 1/2013 | Langer | H03F 1/56 |
| | | | 330/127 |
| 2013/0069737 A1 | 3/2013 | See et al. | |
| 2013/0107914 A1 | 5/2013 | Park et al. | |
| 2014/0044021 A1* | 2/2014 | Alberth, Jr | H04B 1/18 |
| | | | 370/278 |
| 2014/0055210 A1* | 2/2014 | Black | H04B 1/525 |
| | | | 333/132 |
| 2015/0305035 A1 | 10/2015 | Hu et al. | |
| 2016/0020862 A1 | 1/2016 | Morshedi et al. | |
| 2016/0127993 A1* | 5/2016 | Wang | H04W 52/0229 |
| | | | 370/311 |
| 2017/0272108 A1 | 9/2017 | Filipovic et al. | |
| 2017/0317709 A1* | 11/2017 | Prendergast | H04B 1/401 |

* cited by examiner

RADIO CONTROL BASED ON OPERATIONAL PERFORMANCE FEEDBACK

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or the mobile station may include one/or more antennas for transmitting and/or receiving wireless signals. At least one of these antennas may be tunable.

The number of antennas used in smartphones and other wireless communication devices is continuing to increase. This increase is driven in part by the proliferation of spectral bands used for wireless communications and increased demand for diversity/MIMO (Multiple Input, Multiple Output) receivers that employ multiple antennas. In particular, the advent of $5^{th}$ generation wireless networks (5G) is expected to increase the number of antennas required and make the overall antenna design more challenging. Another driving factor for more antennas is increased demand for support of multiple GNSS (Global Navigation Satellite System) frequency bands in smartphones, in particular support of L5-band signals in addition to the traditionally supported L1-band signals. With so many antennas being used, it is difficult for designers to fit them all in the confines of the form factor of many wireless devices, e.g., smartphones.

SUMMARY

An example of a wireless communication system includes: a first sub-system including a first radio and a second radio, each of the first radio and the second radio including a transceiver or a receiver; and a second sub-system coupled to the first sub-system and including: a first antenna configured to convey signals; a first tuner coupled to the first antenna; and a controller coupled to the first tuner, the controller being configured to cause the first tuner to adjust a characteristic of the first tuner; where the controller or the first tuner, or a combination thereof, is configured to provide, to the first sub-system, an indication of an effect on operational performance of a portion of the second sub-system coupled to the second radio based on operation of the first tuner or the first antenna, or a combination thereof; where the first sub-system is configured to modify operation of the second radio based on the indication of the effect on operational performance.

Implementations of such a system may include one or more of the following features. The indication of the effect on operational performance is a quantitative value of a metric. The metric includes: an efficiency of an antenna coupled to the second radio; or a frequency of parameter change of the first tuner; or a noise introduced into the portion of the second sub-system coupled to the second radio; or a loss introduced into the portion of the second sub-system coupled to the second radio; or a combination of any two or more thereof. To modify operation of the second radio the first sub-system is configured to: modify a mode of operation of the second radio; or modify an algorithm implemented by the second radio; or modify an operating parameter of the second radio; or a combination of any two or more thereof. The second radio comprises a satellite positioning system (SPS) receiver configured to: adjust a noise figure parameter of the SPS receiver based on the indication of the effect on operational performance; or disable, based on the indication of the effect on operational performance, processing of signals that are expected not to provide positioning quality above a threshold; or a combination thereof.

Also or alternatively, implementations of such a system may include one or more of the following features. The indication of the effect on operational performance is a qualitative indication corresponding to operational performance of at least the first tuner or the first antenna, or a combination thereof. The second sub-system further includes a second tuner at least partially separate from the first tuner, and the first tuner and the second tuner, respectively, are coupled to the first antenna at different feed points of the first antenna. The second sub-system further includes a second tuner at least partially separate from the first tuner, and a second antenna at least partially separate from the first antenna and coupled to the second tuner, the first radio being coupled to the first tuner and the second radio being coupled to the second tuner. The controller is configured to cause the first tuner to adjust the characteristic of the first tuner based on: a present use of the system; or a location of the system; or a reception environment of the system; or a combination of any two or more thereof.

An example of a method of adjusting operation of a wireless communication device includes: conveying first signals in a wireless communication device between a first radio, of a first sub-system, and a second sub-system, the second sub-system including a first antenna and a first tuner; determining an indication of an effect on operational performance of a portion of the second sub-system coupled to a second radio of the first sub-system based on operation of the first tuner or the first antenna, or a combination thereof adjusting operation of the second radio based on the indication of the effect on operational performance; where the first radio and the second radio each comprise a transceiver or a receiver.

Implementations of such a method may include one or more of the following features. Determining the indication of the effect on the operational performance includes determining a quantitative value of a metric of the first sub-system. Adjusting operation of the second radio includes: modifying a mode of operation of the second radio; or modifying an algorithm implemented by the second radio; or modifying an operating parameter of the second radio; or a combination of any two or more thereof. The second radio includes a satellite positioning system (SPS) receiver and adjusting operation of the second radio includes: adjusting a noise figure parameter of the SPS receiver based on the indication of the effect on operational performance; or disabling, based on the indication of the effect on operational performance, processing of signals that are expected not to provide positioning quality above a threshold; or a combination thereof. The method further includes adjusting a characteristic of the first tuner based on: a present use of the wireless communication device; or a location of the wireless communication device; or a reception environment of the wireless communication device; or a combination of any two or more thereof.

An example of a wireless communication device includes: antenna means for transducing signals between electrical signals and wireless signals; first radio means for processing first signals; second radio means for processing second signals; tuning means, coupled to the first radio means, the second radio means, and the antenna means, for providing an adjustable characteristic; and determining means for determining an indication of an effect on operational performance of portions of the tuning means and the antenna means coupled to the second radio means based on operation of portion of the tuning means or the antenna means, or a combination thereof, coupled to the first radio means; where the second radio means are further for altering processing of the second signals based on the indication of the effect on operational performance.

Implementations of such a device may include one or more of the following features. The determining means are for determining the indication of the effect on the operational performance as a quantitative value of a metric of the antenna means, or the tuning means, or a combination thereof. The metric includes: an efficiency of an antenna of the antenna means; or a frequency of parameter change of a tuner of the tuning means; or a noise introduced into the portions of the tuning means and the antenna means coupled to the second radio means; or a loss introduced into the portions of the tuning means and the antenna means coupled to the second radio means; or a combination of any two or more thereof. The second radio means are for altering processing of the second signals by: modifying a mode of operation of the second radio means; or modifying an algorithm implemented by the second radio means; or modifying an operating parameter of the second radio means; or a combination of any two or more thereof. The second radio means are for altering processing of the second signals by: adjusting a noise figure parameter of the second radio means based on the indication of the effect on operational performance; or disabling, based on the indication of the effect on operational performance, processing of signals that are expected not to provide positioning quality above a threshold; or a combination thereof.

Also or alternatively, implementations of such a device may include one or more of the following features. The tuning means include: a first tuner coupled to the first radio means; and a second tuner coupled to the second radio means; where the first tuner and the second tuner are coupled to the antenna means at different feed points of the antenna means. The tuning means are coupled to second radiating means, and the tuning means are for providing an adjustable impedance to the second radiating means. The tuning means include a tuner and the determining means are for determining a tuning state of the tuner. The tuning means are for adjusting the adjustable characteristic based on: a present use of the system; or a location of the system; or a reception environment of the system; or a combination of any two or more thereof.

An example of a non-transitory, processor-readable storage medium includes processor-readable instructions for causing a processor to: determine an indication of an effect on operational performance, in a wireless mobile communication device, of a second tuner coupled to a second radio or a second antenna coupled to the second radio, or a combination thereof, based on operation of a first tuner coupled to a first radio or a first antenna coupled to the first radio, or a combination thereof; and adjust operation of the second radio based on the indication of the effect on operational performance.

Implementations of such a storage medium may include one or more of the following features. The instructions configured to cause the processor to determine the indication of the effect on operational performance are configured to cause the processor to determine quantitative value of a metric, where the metric comprises: an efficiency of an antenna coupled to the second radio; or a frequency of parameter change of the first tuner; or a noise introduced into a portion of the wireless mobile communication device coupled to the second radio; or a loss introduced into the portion of the wireless mobile communication device coupled to the second radio; or a combination of any two or more thereof. The instructions configured to cause the processor to adjust operation of the second radio include instructions configured to cause the processor to: modify a mode of operation of the second radio; or modify an algorithm implemented by the second radio; or modify an operating parameter of the second radio; or a combination of any two or more thereof. The instructions configured to cause the processor to adjust operation of the second radio include instructions configured to cause the processor to: adjust a noise figure parameter of the second radio based on the indication of the effect on operational performance; or disable, based on the indication of the effect on operational performance, processing of signals that are expected not to provide positioning quality above a threshold; or a combination thereof. The storage medium further includes instructions configured to cause the processor to adjust a characteristic of the first tuner based on: a present use of the wireless mobile communication device; or a location of the wireless mobile communication device; or a reception environment of the wireless mobile communication device; or a combination of any two or more thereof.

DETAILED DESCRIPTION

Figure 1:
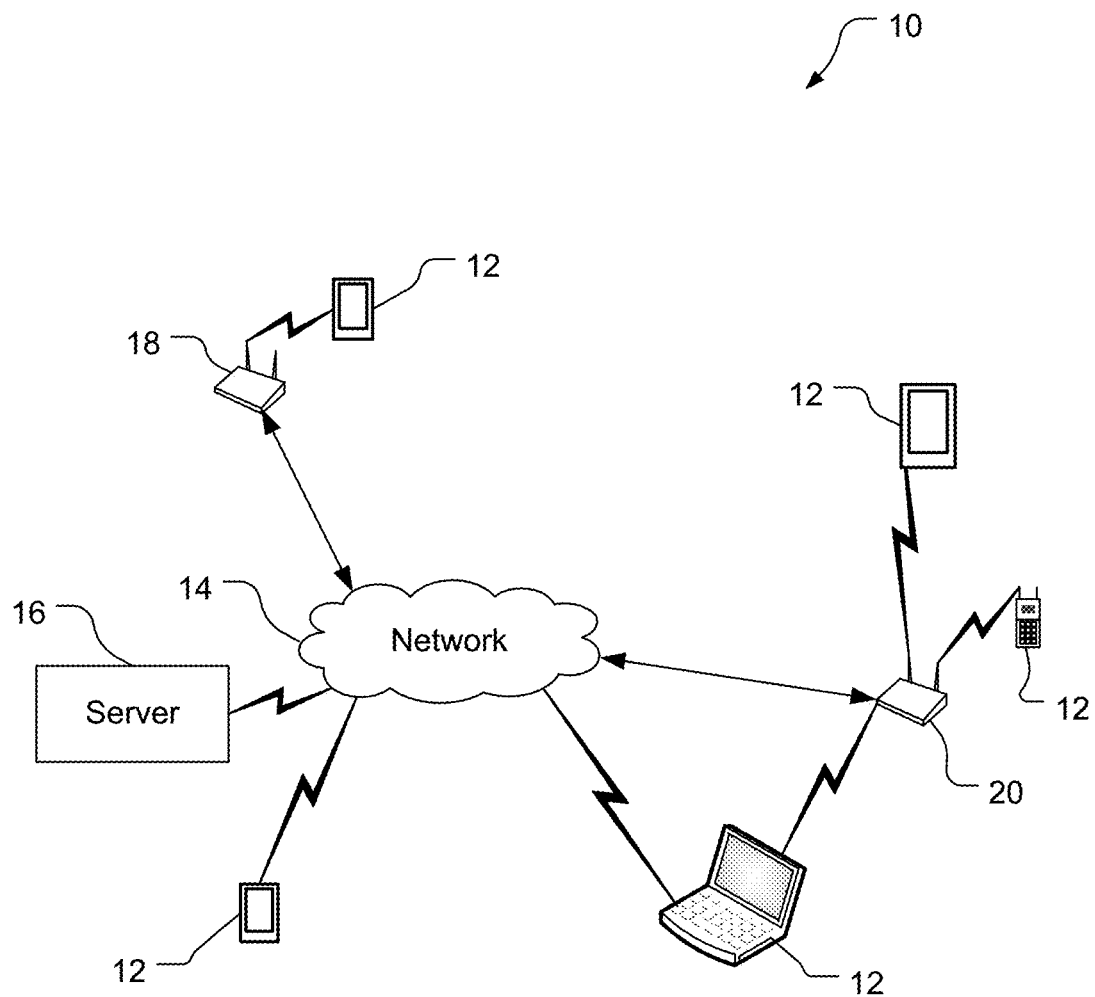
FIG. 1 is a schematic diagram of a communication system.

Techniques are discussed herein for adjusting operation of components of a wireless communication system based on an operation of one or more antenna tuners and/or one or more antennas. The antenna tuners may be impedance tuners and/or antenna aperture tuners. An operational effect may be determined based on operation of the tuner(s) and/or the antenna(s). The operational effect may be an effect seen by one radio (an affected radio) based on operation of the tuner(s) and/or antenna(s) for one or more other radios. The operation may be, for example, frequency(ies) of signals conveyed by the tuner(s) and/or antenna(s), tuner state(s) of the tuner(s), etc. An indication of the operational effect (i.e., an effect indication) may be fed back and used to control operation of a transceiver or a receiver of a wireless communication system, e.g., of the affected radio. For example, the operation of a tuner and/or antenna may be used to determine a noise figure parameter of a receiver, or to determine not to process signals that would not yield quality results. The indication of the operational effect may directly indicate an effect, e.g., with the indication being a quantity of expected dB degradation in signal amplitude, or indirectly indicate an effect, e.g., with the indication being a tuning state, frequency of operation, etc., and this information may be used to determine an effect on operation. The indicated effect may be used to determine how to alter operation of a transceiver or a receiver accordingly. The indication of operational effect may be an indication of a combination of conditions, e.g., state(s) of tuner(s), frequency(s) of operation of the tuner(s) and/or antenna(s), presence of jamming signal(s), etc. The operational effect may be determined for one or more conditions and/or combinations of conditions for a system design such that knowledge of the condition(s) may be used to alter operation of one or more radios in the system. Also or alternatively, the use to which one or more radios of a wireless communication system is being put, a location of the wireless communication system, and/or an environment of the wireless communication system may be used to control an antenna tuner of the wireless communication system.

Techniques discussed may be used in various configurations. For example, techniques discussed may be used where multiple antennas are configured and disposed such that adjusting (e.g., optimizing) performance of one antenna affects another antenna. As another example, techniques discussed may be used where a single antenna is fed with multiple signals (either at a common feed or at multiple feed locations) and adjusting operation regarding one of the signals affects operation with respect to the other signal. As another example, techniques discussed may be used where multiple antennas are disposed and configured such that altering operation regarding one of the antennas affects operation regarding another of the antennas. The multiple antennas may be passing signals of different bands or may be passing signals of the same band and same frequency (e.g., for MIMO operation).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

Items and/or techniques described herein may provide one or more of the following capabilities, as well as other capabilities not mentioned. Antenna performance can be improved across a wide signal bandwidth, e.g., using a shared antenna. An antenna aperture and/or impedance can be adjusted dynamically to improve antenna performance in a particular frequency band. A mode, algorithm, and/or operating parameter of a transceiver and/or a receiver may be modified based on an expected operational performance effect on one radio due to operation related to another radio to improve transceiver and/or receiver performance. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

Referring to FIG. 1, a communication system 10 includes wireless communication devices 12, a network 14, a server 16, and access points (APs) 18, 20. The system 10 is a communication system in that components of the system 10 can communicate with one another directly or indirectly, e.g., via the network 14 and/or one or more of the access points 18, 20 (and/or one or more other devices not shown, such as one or more base transceiver stations). For indirect communications, the communications may be altered during transmission from one entity to another, e.g., to alter header information of data packets, to change format, etc. The example wireless communication devices 12 shown include mobile phones (including smartphones), a laptop computer, and a tablet computer. Still other wireless communication devices may be used, whether currently existing or developed in the future.

Figure 2:
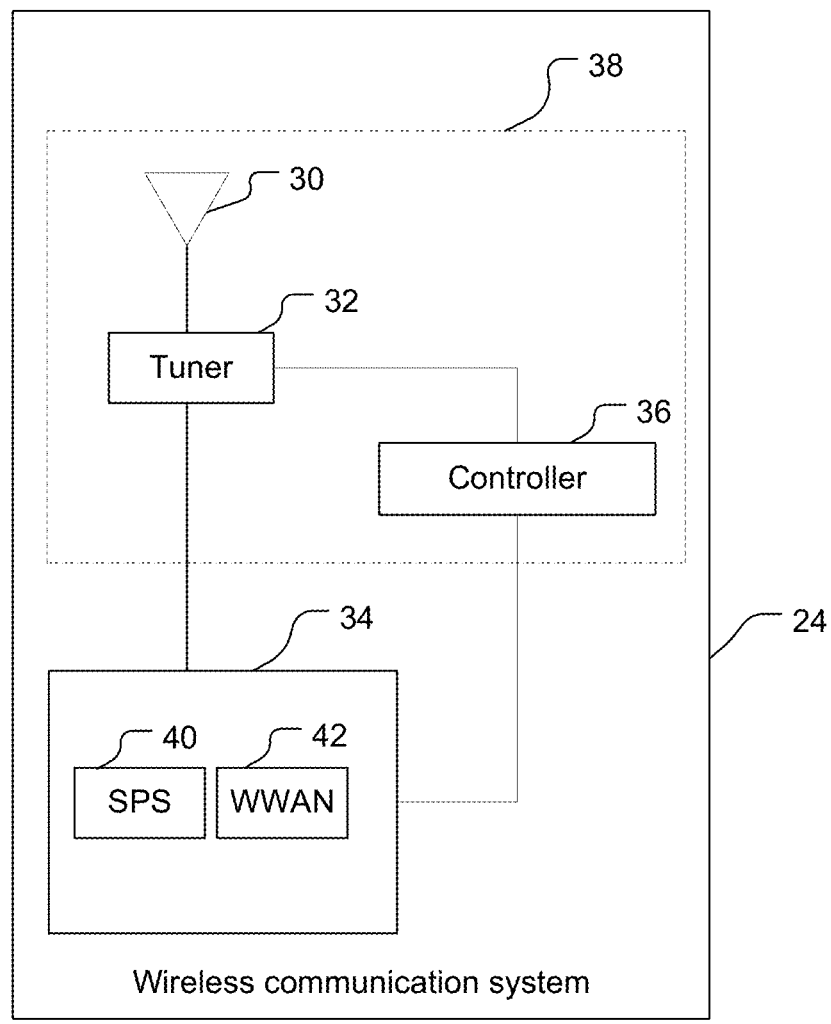
FIG. 2 is a block diagram of components of an example of a wireless communication device shown in FIG. 1.

Referring also to FIG. 2, a wireless communication system 24 is an example of portions of any of the wireless communication devices 12 and includes an antenna 30, a tuner 32, a set of radios 34, and a controller 36. The set of radios 34 are in a first sub-system of the system 24 and the antenna 30, the tuner 32, and the controller 36 are in a second sub-system 38 of the system 24. The tuner 32 is coupled to the antenna 30, the set of radios 34, and the controller 36. The set of radios 34 is coupled to the tuner 32 (e.g., via a front-end circuit not shown), the antenna 30 (via the tuner 32), and the controller 36. The controller 36 is coupled to the tuner 32 and the set of radios 34. The antenna 30 is configured to convey, e.g., send and/or receive, signals, with the signals being provided by and/or useful to at least one of the radios in the set of radios 34. The antenna 30 may be configured to transduce signals between electrical signals and wireless signals. The antenna 30 may be configured to transduce electrical signals from a radio into wireless signals and to emit the wireless signals and/or may be configured to transduce wireless received signals into electrical signals and provide the electrical signals to the tuner 32. The wireless communication system 24 may be configured to use a tuner state of the tuner 32 to modify operation of one or more radios of the set of radios 34. The wireless communication system 24 may be part of a larger system, e.g., with more antennas and more radios as discussed below. While in the example of FIG. 2, the wireless communication system 24 is configured for bi-directional communication, other examples of wireless communication systems, e.g., receive-only wireless communication systems, may be used. For example, a wireless communication system may be configured to receive satellite signals and/or other signals without being configured to transmit communication signals.

The set of radios 34 includes radios that each include one or more appropriate components, e.g., a transceiver and/or a receiver, for sending and/or receiving corresponding signals of a corresponding protocol to and/or from the antenna 30 via the tuner 32. For example, a radio may communicate according to a radio access technology. As another example, a radio may receive satellite signals according to a respective protocol. Different radios may operate with signals of different frequencies. In the example of FIG. 2, the set of radios 34 includes two radios, a Satellite Positioning System (SPS) radio 40, that includes an SPS receiver, and a Wireless Wide Area Network (WWAN) radio 42 that includes a WWAN transceiver. The SPS radio 40 may be any of a variety of, or combination of, SPS radios such as a United States Global Positioning System (GPS) radio, a European Galileo system radio, a Russian GLONASS system radio, one or more other Global Navigation Satellite System (GNSS) radios, and/or one or more radios for positioning systems that may not be global such as a BeiDou Navigation Satellite System (BDS) radio, an Indian Regional Navigation Satellite System (IRNSS) radio, etc. One or more other radios may be included in the set of radios 34 in addition to, or instead of, one or both of the radios 40, 42. Radios of the set of radios 34 may include a number of different components as appropriate, such as demodulator/modulators, a MIMO detector, a receive processor, a transmit processor, and/or a transmit MIMO processor.

The antenna 30 is a shared antenna that passes signals for each of the radios 40, 42 to, or to and from, respectively, the tuner 32. The tuner 32 is thus also shared by the radios 40, 42 and affects the passage of signals for each of the radios 40, 42. The tuner 32 may be coupled to the antenna 30 at multiple locations, e.g., feed points of the antenna 30. Coupling to the antenna 30 at multiple locations may facilitate desired excitation of the antenna, desired reception of signals by the antenna, and/or desired aperture tuning by the tuner 32.

The tuner 32 is configured to have one or more variable characteristics corresponding to selectable tuner states. A tuner state is a condition of the tuner 32 corresponding to one or more selectable parameters (e.g., switch states, impedance values). Each tuner state corresponds to a particular value or particular values of the variable characteristic(s) of the tuner 32 or a value of a combination of variable characteristics of the tuner 32. For example, the tuner 32 may be an impedance tuner configured to have different, selectable impedances, e.g., to help reduce a reflection coefficient of signals sent to the antenna 30 from the tuner 32 and/or to help reduce a reflection coefficient of signals provided to the tuner 32 from the antenna 30. A selectable impedance may be due to a variable component or a combination of multiple variable components (e.g., one or more variable inductors, variable capacitors, and/or variable resistors) and/or one or more selectable fixed impedances (e.g., selected based on the state of one or more switches). Also or alternatively, the tuner 32 may be an aperture tuner configured to change one or more radiation characteristics (e.g., a resonant frequency) of the antenna 30 to help improve radiation by the antenna 30 at a desired frequency or over a desired frequency band. As an aperture tuner, the tuner 32 may have a variable impedance that affects the radiation by the antenna 30.

The selectable states of the tuner 32 may affect operation of the tuner 32, e.g., by facilitating the passage of different signals differently, and thus may differently affect signals corresponding to different radios of the set of radios 34. For example, the tuner 32 may be set to an SPS state (e.g., SPS optimized) in order to have SPS signals received by the antenna 30 and passed through the tuner 32 to the set of radios 34 in an efficient manner, e.g., with as low of loss as can be provided to the SPS signals by the antenna 30 and the tuner 32. In the SPS state, WWAN signals may not be passed through the tuner 32 or a combination of the tuner 32 and the antenna 30 as efficiently as when the tuner 32 is set to a WWAN state. Similarly, with the tuner 32 set to a WWAN state, SPS signals may not be received and/or passed as efficiently as when the tuner 32 is set to an SPS state. In the different states, the tuner 32 may, for example, have different impedance values that better match an impedance of the antenna 30, or that adjust a radiation characteristic of the antenna 30 to better radiate/receive signals corresponding to the different states. The different states correspond to different operation of the tuner 32, e.g., for different frequencies and/or different purposes.

Operation of the tuner 32 and/or the antenna 30 for use with one of the radios in the set of radios 34 may have an effect on operational performance of a portion of the subsystem 38 used with another radio of the set of radios 34. Here, the antenna 30 and the tuner 32 are both used with the SPS radio 40 and the WWAN radio 42. Operation of the antenna 30 and/or the tuner 32 may be tailored for use with one radio, e.g., the SPS radio 40, and this may have an effect on operational performance of the antenna 30 and/or the tuner 32 for use with another radio, e.g., the WWAN radio 42. For example, the antenna 30 and the tuner 32 may be configured to facilitate (e.g., optimize) passage of signals at SPS frequencies and this may result in a loss to signals at WWAN frequencies, at least relative to when the antenna 30 and the tuner 32 are configured to facilitate (e.g., optimize) passage of WWAN signals. The antenna 30 and the tuner 32 are optimized to pass certain signals when the antenna 30 and the tuner 32 are configured to pass those signals as best as the antenna 30 and the tuner 32 can within the constraints of the system 24 (e.g., what impedances can be selected for the tuner 32) even though better (e.g., lower loss) configurations may be theoretically possible.

The controller 36 is configured to determine an indication of the effect on operational performance of the antenna 30 and the tuner 32 for use with one radio of the set of radios 34 based on operation of the antenna 30 and the tuner 32 for use with another radio of the set of radios 34. For example, through empirical evidence, the controller 36 may store a look-up table of effects on operational performance as a function of operational parameters of the antenna 30 and/or the tuner 32. For example, a look-up table may relate impedance of the tuner 32 and/or frequency of operation of the antenna 30 to loss as a function of frequency. The controller 36 may provide the indication of the effect on operation performance to the other radio and the other radio may adjust operation based on the indicated effect. The effect indication may vary, e.g., as a function of frequency, and the adjustment to radio operation may vary, e.g., as a function of frequency (e.g., a signal amplitude from a radio may vary as a function of frequency).

The effect indication may be a direct indication or an indirect indication (e.g., an indication from which an effect can be determined). A direct indication may be, for example, a quantity of loss as a function of frequency, a negative effect of jamming signals being received (e.g., noise or loss introduced), etc. An indirect indication is an indication from which an effect on operation relative to a radio can be determined. For example, an indirect effect indication may be an indication of operation of the tuner 32 and/or the antenna 30, e.g., for one radio, with the operation thereof having a known or derivable effect on operation on another radio desired to be used. A quantitative effect may be determined from the indirect indication, for example, from a look-up table of qualitative effect and quantitative effect, with the quantitative effect values based on empirical evidence. Also or alternatively, an indirect indication may be associated with a corresponding reaction (e.g., increase transmission magnitude by 3 dB) without determining a specific quantitative effect.

The indication of the effect on operational performance may be qualitative or quantitative. For example, with the antenna 30 shared between the SPS radio 40 and the WWAN radio 42, a qualitative indication of effect on operational performance may be a mode such as "emergency calling" or "video gaming," or a description of jamming being received (e.g., "high jamming" or "low jamming"), or a description of preferred/prioritized signal processing such as "SPS optimized" or "WWAN optimized" or an indication of no preference or a balance such as "compromise." For "optimized" configurations, the configuration may not be the absolute optimum that it could be, but may be a configuration that favors the associated signals, e.g., presents less loss to the associated signals (e.g., SPS signals) than other signals (e.g., WWAN signals). The qualitative indication may indicate which, if any, signals are favored and thus of which signals the tuner 32 (in combination with the antenna 30) is configured to facilitate the passing and/or radiation best. A quantitative indication of the effect on operational performance may be a value of a metric of the sub-system 38. For example, a quantitative indication may be a value of a tuner characteristic such as impedance of the tuner 32. Also or alternatively, a quantitative indication may indicate an estimated efficiency loss for corresponding signals, e.g., of one or more indicated frequency bands. For example, a quantitative indication may indicate a loss in dB for a GNSS L5 frequency band and/or a loss in dB for a WWAN frequency band. Other examples of quantitative indications are antenna efficiency, frequency of parameter changes in the tuner 32, noise introduced, loss introduced. Qualitative indications may be associated with corresponding quantitative effects, e.g., losses and/or noise amounts. For example, an "SPS optimized" indication may correspond to a 5 dB loss for a WWAN frequency band, a "WWAN optimized" indication may correspond to a 7 dB loss for an SPS frequency band, etc. A "compromise" indication may correspond to loss for each of the radios 40, 42, e.g., 3 dB for the SPS radio 40 and 4 dB for the WWAN radio 42. These loss values provided are examples only. As another example, qualitative indications of "good," "medium," and "bad" may correspond to noise amounts of less than or equal to a first noise amount (e.g., 2 dB), between the first noise amount and a second noise amount (e.g., 5 dB), and equal to or above the second noise amount. The indication of effect on operational performance may comprise a combination of one or more quantitative indications and/or one or more qualitative indications, with the receiving radio being configured (e.g., with stored data) to use the received indication to adjust (if appropriate) operation.

The system 24 may be configured to use the indication of effect on operational performance to affect operation of one or more radios in the set of radios 34. For example, when the tuner 32 is set to a state to facilitate passage of SPS signals, to the system 24 may adjust operation of the WWAN radio 42, e.g., by increasing a magnitude of transmitted signals. As another example, if the tuner 32 is set for WWAN operation and is changed to being set for SPS operation, then the SPS radio 40 may be adjusted in response to indication of effect on operational performance indicating that the tuner 32 is set for SPS operation.

The controller 36 is shown in FIG. 2 as being separate from the tuner 32 and the set of radios 34, but this is a functional depiction for explanatory purposes and the controller 36 may or may not be physically implemented as shown in FIG. 2. For example, the controller 36 may be distributed in the system 24, with one or more portions being disposed in one or more respective radios of the set of radios 34, and/or with a portion disposed in the tuner 32 (or multiple portions in respective tuners if there are multiple tuners, as discussed below). One or more functions described as being performed by the controller 36 may be performed by the tuner 32 and/or one or more radios of the set of radios 34. For example, the tuner 32 may, at least partially, determine an indication of an effect on operational performance of the antenna 30 and the tuner 32. As another example, the controller 36 may be described as being configured to cause, or causing, the tuner 32 and/or a radio to alter operation, and this may be done by providing an indication of expected operational effect in response to which the tuner 32 (or tuners) and/or one or more radios of the set of radios 34 alter their respective operation. In a distributed example, one or more radios may have a processor disposed in the radio (e.g., SPS receivers and WLAN transceivers often have their own processors). Thus, the description herein will refer to the controller 36 as implementing various functions without regard to where in the system 24 the functions are implemented.

Figure 3:
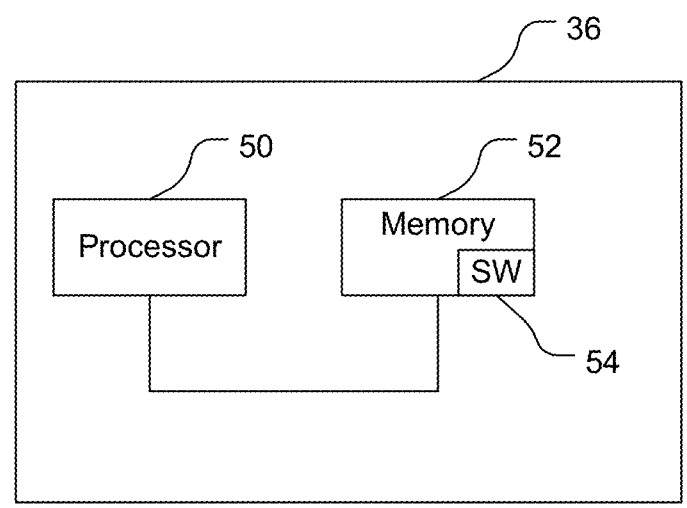
FIG. 3 is a block diagram of components of a controller shown in FIG. 2.

Referring also to FIG. 3, the controller 36 comprises a computer system including a processor 50 and memory 52, including software 54. The processor 50 may be an intelligent hardware device, e.g., a central processing unit (CPU) such as those made by QUALCOMM®, ARM®, Intel® Corporation, or AMD®, a microcontroller, an application specific integrated circuit (ASIC), etc. The processor 50 could comprise multiple separate physical entities that can be distributed in the wireless communication system 24. The memory 52 is a non-transitory storage medium that includes random access memory (RAM) and read-only memory (ROM). The memory 52 stores the software 54 which is processor-readable, processor-executable software code containing instructions that are configured to, when executed, cause the processor 50 to perform various functions described herein (although the description may refer only to the processor 50, or the wireless communication system 24, performing the functions). Alternatively, the software 54 may not be directly executable by the processor 50 but configured to cause the processor 50, e.g., when compiled and executed, to perform the functions. Alternatively still, the controller 36 may be implemented as an ASIC or other hardware device alone or with firmware but with a memory and software.

The controller 36 may be configured to provide control signals to the tuner 32 to adjust or set a state of the tuner 32. For example, the controller 36 may be configured to respond to selection of a communication protocol, e.g., by selection of a cellular service provider (e.g., according to a subscriber identification module in the wireless communication device 12), by sending control signals to the tuner 32 to set one or more characteristics (e.g., impedance) of the tuner 32 for good efficiency at the frequency corresponding to the selected cellular service provider. The control signals may directly cause the tuner 32 to set the one or more characteristics, e.g., by directly causing one or more switches to be open or closed and/or to set a value of a variable element. Alternatively, the control signals may indirectly cause the tuner 32 to set the one or more characteristics, e.g., by being interpreted and converted in the tuner to further control signals. The control signals (or further control signals) may selectively actuate one or more switches of the tuner 32 to set or adjust the state of the tuner 32.

The controller 36 may be configured to determine and provide one or more indications of an effect on operational performance of the antenna 30 and/or the tuner 32 and/or a radio to one or more other radios of the set of radios 34. For example, the controller 36 may determine operation of the tuner 32 (e.g., a tuner state) by monitoring the tuner 32, e.g., if a processor in a radio set the tuner state and a separate processor is to provide the indication of the tuner state. Also or alternatively, the controller 36 may determine the operation of the tuner 32 by using knowledge of operation of the tuner 32 set by the controller 36. The controller 36 may further monitor operation of, and/or receive information indicating, operation of the antenna 30 and/or a radio using the tuner 32 and the antenna 30. For example, the controller 36 may determine one or more frequencies and/or amplitudes of signals being conveyed through the antenna 30 and the tuner 32. The controller 36 may use information of the operation of the antenna 30 and/or the tuner 32 and/or the radio using the antenna 30 and the tuner 32 to determine an effect on operational performance for one or more other radios. The controller 36 may feed the effect on operational performance back to one or more radios of the set of radios 34. This feedback may be from one software entity to another in one processor or may be from one processor to another. The indication of the effect may or may not be provided to all the radios of the set of radios 34. For example, if the tuner 32 and/or the antenna 30 is configured (e.g., set) for SPS operation (to facilitate reception and/or passage of SPS signals), then an indication of the effect on operational performance for WWAN signals may be determined and provided to the WWAN radio 42 but not the SPS radio 40. Thus, if the tuner 32 and/or the antenna 30 is set to facilitate transmission and/or reception and/or radiation of signals corresponding to one radio, then the indication of the effect on operational performance for one or more other radios may be provided only to the one or more other radios to which the operation of the tuner 32 and the antenna 30 is relevant (e.g., in response to which the one or more other radios may set (e.g., change as appropriate) its operation).

The indication of the effect on operational performance from the controller 36 may cause a change in operation of at least one transceiver and/or at least one receiver of the set of radios 34. The controller 36 may cause one or more of the radios 40, 42 to modify operation of the respective radio 40, 42 based on the effect indication. One or more of the radios 40, 42 (e.g., a processor in a respective radio) may respond to the effect indication by modifying a mode of operation, an algorithm implemented by, and/or an operating parameter of a transceiver or a receiver of the respective radio. For example, a receiver of the SPS radio 40 may adjust an internal noise figure parameter value based on an estimated efficiency loss. The noise figure parameter value would affect the measurement uncertainties computed by the receiver and thus the position accuracy computed by the receiver. The estimated efficiency loss may be directly indicated by the effect indication. The estimated efficiency loss may be indirectly indicated by the effect indication, e.g., with a look-up table accessible by (e.g., stored by) the SPS radio 40 including one or more qualitative indications of operation of the tuner 32 and/or the antenna 30 and a corresponding efficiency loss for each indication of operation. As another example, the SPS radio 40 may disable processing circuitry, e.g., L5 processing circuitry, of the SPS radio 40 in response to the operation of the antenna 30 and/or the tuner 32 being configured to facilitate WWAN processing, e.g., a "WWAN optimized" state, or in response to an efficiency loss indicated by a quantitative effect indication or implied by a qualitative effect indication being greater than a threshold of acceptable efficiency loss. Turning off the processing circuitry can save power in situations where reception of signals to be processed by the processing circuitry is expected to be too poor to provide valuable results, e.g., benefit in positioning accuracy such that positioning quality is above a threshold (e.g., positioning accuracy within a threshold). As another example, the SPS radio 40 may modify an algorithm that the SPS radio 40 uses to generate measurements of the relative velocity between the wireless communication device 12 and satellites in an SPS in response to a change in operation of the antenna 30 and/or the tuner 32 and/or another radio using the antenna 30 and the tuner 32. If the operation of the sub-system 38 is unchanged during a velocity measurement period, then the SPS radio 40 may use carrier-phase measurements at the beginning and end of the measurement period to compute the velocity. A change in operation of the tuner 32 may cause a disturbance in the carrier-phase measurements due to differences in tuner phase responses before and after the change. Therefore, when the operation of the tuner 32 changes during a velocity measurement period, the SPS radio 40 may use Doppler or carrier-frequency measurements to compute the velocity instead of carrier-phase measurements.

Figure 4:
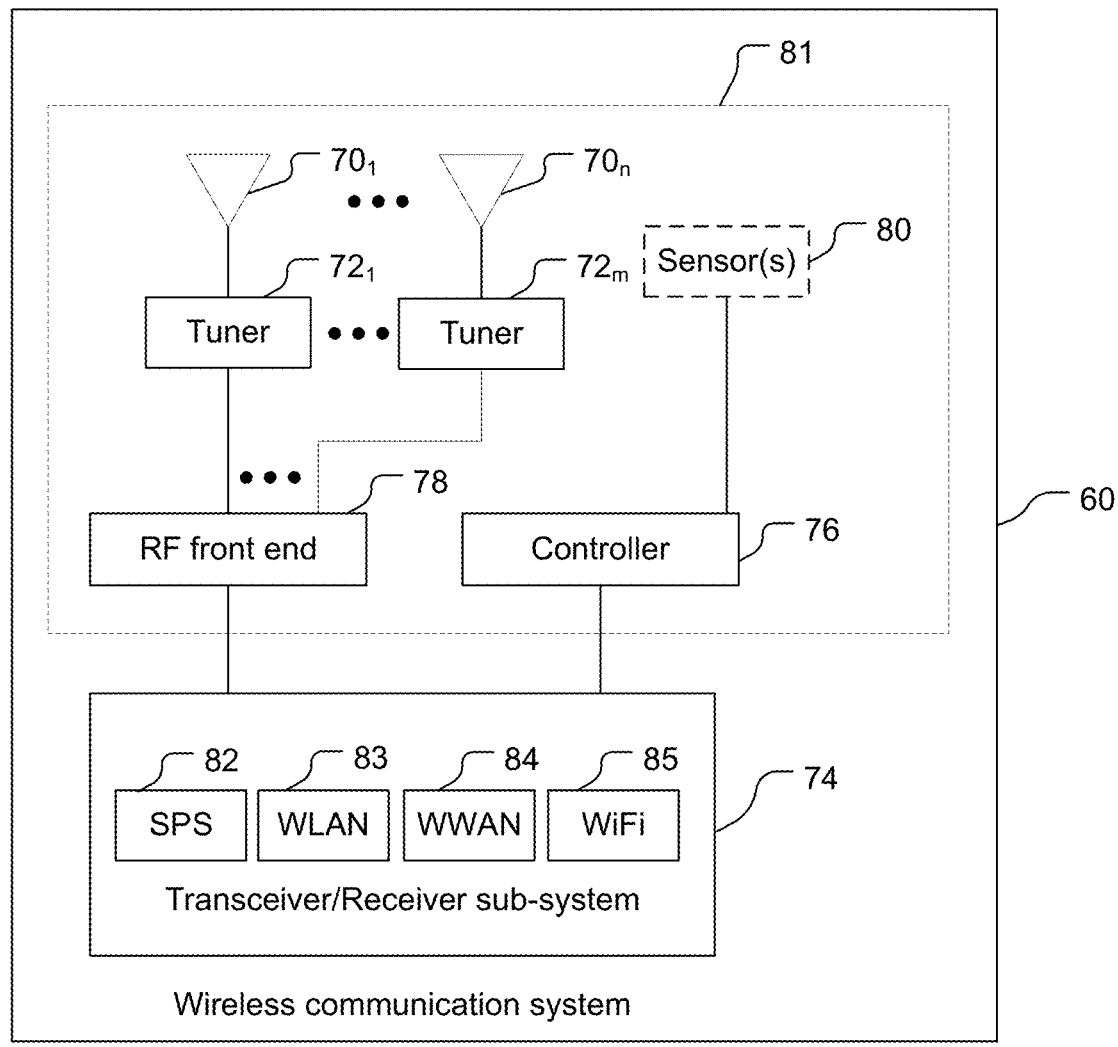
FIG. 4 is a diagram of components of another example of a wireless communication device shown in FIG. 1.

Referring also to FIG. 4, a wireless communication system 60 is another example of portions of any of the wireless communication devices 12 and includes antennas 70, tuners 72, a set of radios 74, a controller 76, a radio frequency (RF) front end 78, and one or more sensors 80. The set of radios 74 are a sub-system of the system 60 and the antennas 70, the tuners 72, the controller 76, and the RF front end 78 are in another sub-system 81 of the system 60. The system 60 includes n antennas $70_1$-$70_n$ and m tuners $72_1$-$72_m$. The quantities of the antennas 70 and the tuners 72 may or may not be equal, e.g., with the quantities being inequal if multiple tuners share an antenna and/or if one radio uses multiple antennas (e.g., MIMO operation). Multiple tuners 72 may connect to a single antenna 70 at multiple feed points. The multiple tuners 72 may be at least partially separate from each other (e.g., have at least one non-shared component). Two or more antennas may share one or more components such that one antenna is partially separate from another antenna. The system 60 is similar to the system 24 shown in FIG. 2 except that there are multiple antennas, multiple tuners, and more than the two radios 40, 42 shown in FIG. 2. The system 24 shown in FIG. 2 is an example of the system 60 shown in FIG. 4 with one antenna, one tuner, with only the SPS and WWAN radios, and without some components shown. FIG. 4 shows the RF front end 78 while FIG. 2 does not show an RF front end but the system 24 will typically have an RF front end. Further, FIG. 4 shows that the system 60 optionally includes one or more sensor 80 while FIG. 2 does not for the system 24, but the system 24 may include one or more sensors as well. In this example, the set of radios 74 includes an SPS radio 82, a Wireless Local Area Network (WLAN) radio 83, a WWAN radio 84, and a WiFi radio 85. Different quantities of radios than that shown may be used. Radios other than those shown may be included, and one or more of the radios shown may be omitted or replaced.

Components of the system 60 may provide one or more means for performing corresponding functions. For example, the tuners 72 (or a single one of the tuners 72) may provide a tuning means for providing an adjustable characteristic to radiating means (that may be provided by one or more of the antennas 70). The controller 76 may also provide a portion of the tuning means, e.g., to set a tuning state of one or more of the tuners 72. The controller 76 may provide determining means for determining an indication of an effect on operational performance of a portion of the sub-system 81 coupled to one of the radios 82-85 for use of that radio based on operation of the sub-system 81 coupled to one or more of the other radios. The indication of the effect may be a direct indication as discussed above, or indirect. An indirect indication may indicate operation of one or more of the antennas 70 and/or one or more of the tuners 72 (e.g., what states the tuners 72 are in and/or what frequencies are being conveyed by the tuners 72 and the antennas 70). One or more of the radios 82-85 (and/or one or more other radios) may provide radio means for processing signals. The controller 76 may also form a portion of radio means for altering operation of one or more radios.

The sensor(s) 80 comprise one or more sensors configured to measure one or more environmental conditions and/or characteristics and provide one or more corresponding indications to the controller 76. For example, the sensor(s) 80 may include a temperature sensor, a pressure sensor, and/or a light sensor configured to measure and provide indications of the temperature, pressure, and/or light intensity of the environment in which the system 60 is disposed.

The set of radios 74 and the RF front end 78 may provide multiple signal chains that may be used, for example, to convey signals for different networks and/or for different purposes (e.g., Wi-Fi communication, multiple frequencies of Wi-Fi communication, satellite positioning, one or more types of cellular communications (e.g., GSM (Global System for Mobiles), CDMA (Code Division Multiple Access), LTE (Long-Term Evolution), 5G, etc.). The set of radios 74 may be configured to send signals to, and to receive signals from, the RF front end 78. The set of radios 74 may be configured to produce an outbound signal, for example in a baseband, and to send this signal to a transmitter of the RF front end 78. The signal provides appropriate information, e.g., outgoing voice, uploading data, etc. for transmission by the RF front end 78, e.g., to a cellular tower, an access point, etc., via an appropriate one of the antennas 70. The set of radios 74 may be further configured to receive inbound signals from RF front end 78 received from the antennas 70.

The controller 76 is similar to the controller 36 in that the controller 76 can control the tuners 72 and can determine and provide indications of effects on operational performance to the set of radios 74. An indirect effect indication may be an indication of a state of one or more of the tuners 72 and/or of operation of (e.g., frequency(ies) and/or amplitude(s) of signal(s) conveyed by) one or more of the antennas 70. For example, the controller 76 may determine and send an indication including the state of each of the tuners 72, or an indication including the states of each of multiple ones of, but less than all of, the tuners 72. The controller 76 may determine and send one or more indications including a combined tuner state that is a combination of states of two or more of the tuners 72. For example, the controller 76 may determine and send an indication including a tuner state that is a combination of the states of all of the tuners 72. As another example, the controller 76 may send an indication including a tuner state where the tuner state is a combination of states of more than one, but less than all, of the tuners 72. The controller 76 may send an indication including the tuner state of tuners 72, with corresponding radios, whose combined operation affects the performance of another one of the radios, e.g., a radio that uses an antenna 70 that is near (e.g., that mutually couples with) the antennas 70 corresponding to the tuners 72 whose combined tuner state is provided. For example, assume that the radios 82-85 each use a separate one of the antennas 70, with corresponding separate tuners 72, that are disposed in the order of the radios 82-85 as shown (i.e., the antenna $70_1$ used by the SPS radio 82 is adjacent to the antenna $70_2$ used by the WLAN radio 83, which is adjacent to the antenna $70_3$ used by the WWAN radio 84, which is adjacent to the antenna $70_4$ used by the WiFi radio 85). In this case, the controller 76 may send the WWAN radio 84 an indication of effect on operational performance for the WWAN radio 84 that includes a tuner state that is a combination of the states of the tuners $72_2$, $72_4$. The indication effect may also, or alternatively, include information regarding operation of the antennas $70_2$, $70_4$. An indication of effect on operational performance may include an instruction, e.g., to change to a particular mode (e.g., shut off WiFi processing, shut off L5 band processing, etc.). An effect indication may be directed at (include information relevant to) all radios 82-85, or may be directed to an individual radio, or may be directed to a set of more than one but less than all of the radios 82-85. An effect indication may be sent to all the radios 82-85 or to only the radios to which the indication is relevant. An effect indication may include one or more indications of which radios are active and which antennas 70 correspond to the active radios. This may in turn affect the adjustment of operation of one or more radios based on which radios are active.

An effect indication for the sub-system 81 may be qualitative or quantitative. A qualitative effect indication may be used in conjunction with a formula or look-up table or other means of relating the qualitative indication to effect on a radio to determine how to adjust operation of the radio. For example, a look-up table of qualitative effect indications and corresponding efficiency losses may be used by finding the qualitative effect indication and using a corresponding efficiency loss for a particular radio to set or modify a mode, algorithm, and/or operating parameter of the particular radio based on the efficiency loss. As another example, a quantitative effect indication may indicate efficiency losses for each affected radio. As with the discussion above, the effect indication may vary, e.g., as a function of frequency and a response, e.g., radio operation adjustment, may also vary, e.g., as a function of frequency.

The effects of combined operation characteristics (e.g., tuner states of multiple tuners) may be predetermined for the system 60. The effects may be determined for the design of the system 60 as opposed to each device that includes the system 60. The effects may be determined empirically (e.g., averaging effects of multiple devices including the system 60) for a device design and the effects stored in the system 60, e.g., in a look-up table of operational configurations (e.g., frequencies conveyed, tuner states, etc.) of the sub-system 81 and effects, e.g., efficiency loss corresponding to each radio, a noise figure value of the SPS radio 82, etc. For example, a noise figure value of the SPS radio 82 may depend on the tuner states of the tuners 72 and may be characterized for each combination of tuner states of the tuners 72. The noise figure value may be set dynamically, e.g., by the controller 76 or the SPS radio 82, in response to an indication of the operational configuration of the sub-system 81.

The controller 76 may be configured to determine channel characteristics and to affect one or more of the tuners 72 based on the channel characteristics. The controller 76 can determine channel characteristics (e.g., signal to noise ratio (SNR), path loss, fading, interference, block error rate (BER), SPS measurement uncertainty, etc.) for two or more frequencies and choose a tuner setting based on a desired primary frequency from among the two or more frequencies.

The controller 76 may be configured to determine an application characteristic and to affect the sub-system 81, e.g., one or more of the tuners 72, based on the application characteristic. The controller 76 can determine a present use of the wireless communication system 60 and adjust a tuning state accordingly, e.g., to improve performance of the present use of the system 60. Depending on an application that is using the wireless communication system 60, the controller 76 may prioritize processing of signals. For example, if the controller 76 determines that an emergency call (e.g., e911) application is being used, then positioning performance may be of higher importance than WWAN data rate. The controller 76 may control a tuner 72 that corresponds to an antenna 70 that is shared for SPS and WWAN use to set the tuner 72 to a tuner state designed for high-performance SPS use. In particular, the controller 76 may control such a tuner 72 if the shared antenna 70 is used for WWAN MIMO/diversity features and not as a primary WWAN antenna.

The controller 76 may be configured to determine an environmental characteristic and to affect the sub-system 81, e.g., one or more of the tuners 72, based on the environmental characteristic. The controller 76 can determine a present environment of the wireless communication system 60 and adjust a tuning state accordingly, e.g., to improve performance of one or more applications, to disable one or more applications, etc. Depending on environment, applications may be prioritized differently. The controller 76 may be configured to determine whether the wireless communication system 60 is in a reception environment of poor SPS signal reception quality, e.g., whether the system 60 is deeply indoors, on a subway, in an elevator, in a tunnel, in an underground parking structure, etc. The controller 76 may use information regarding one or more measurements taken by the sensor(s) 80 to help determine the environmental characteristic. For example, a pressure above expected atmospheric pressure may indicate that the system 60 is below ground. As another example, a low light intensity (e.g., below one or more thresholds) may indicate that the system is in a tunnel, in an elevator, or otherwise indoors (or at least not outdoors). Also or alternatively, to determine the environmental characteristic the controller 76 may use other information such as SPS-determined location of the system 60, non-SPS-determined location of the system 60 (e.g., trilateration (e.g., using WiFi access points and/or cellular towers), matching received signal characteristics to a heat-map of location versus received signal characteristics, etc.), location of a wireless device (e.g., an access point or cell tower) in communication with the system 60 (possibly in combination with a signal strength of a signal received from the wireless device), etc. The controller 76 may respond to determining that the system is in a poor SPS signal quality environment by setting the state of one or more tuners 72 to help optimize performance of a non-SPS operation such as WWAN operation. For example, the controller 76 may set a shared tuner for an antenna that is shared for SPS and WWAN operation to help optimize the WWAN operation.

The controller 76 may be configured to determine a location of the system 60 and to affect the sub-system 81, e.g., one or more of the tuners 72, based on the location. The controller 76 may determine the location using the SPS radio 82 and/or by using other information/technique(s) such as trilateration (e.g., using WiFi access points and/or cellular towers), matching received signal characteristics to a heat-map of location versus received signal characteristics, etc.), location of a wireless device (e.g., an access point or cell tower) in communication with the system 60 (possibly in combination with a signal strength of a signal received from the wireless device), etc. For example, the controller 76 may be configured to adjust SPS operation based on a global location of the system 60. SPS receivers typically support a variety of global and regional satellite systems, operating at different carrier frequencies. It may be desirable to attempt to optimize reception of SPS signals corresponding to a country's best SPS signal constellation (e.g., to prefer a constellation of a home country associated with the system 60). Typically, a single antenna is used to cover the GNSS L1 band from about 1559 MHz to about 1606 MHz. It may be desirable to attempt to optimize antenna characteristics for one specific frequency sub-band depending on where the system 60 is located in the world. For example, if the system 60 is operating in China, the tuner state for the GNSS L1 antenna can be set to attempt to improve reception of the BeiDou Navigation Satellite System (BDS) B1 signal centered at 1561.098 MHz. If the system 60 is not in China, the tuner state for the GNSS L1 antenna could be set to attempt to improve reception of the GPS L1 signal centered at 1575.42 MHz. If the system 60 is disposed in India, the controller 76 may set a tuner 72 to attempt to optimize reception of L5 signals corresponding to the geosynchronous IRNSS SPS system.

The controller 76 may thus be configured to adjust operation of a wireless communication device, e.g., of one or more radios, one or more tuners, and/or one or more antennas, based on operational characteristics of the device in many different use scenarios. For example, techniques discussed may be applied to a shared antenna configuration, to a configuration with multiple coupled antennas, and/or to a configuration with one or more antennas with separate feeds for signals of different technologies and/or frequency bands. The controller 76 may adjust a tradeoff between efficiency and coupling based on channel characteristics, application state, SPS reception environment, and/or device location. The controller 76 may implement such adjustments by feeding back an indication of effect on operational performance to one or more transceivers or receivers of one or more corresponding radios.

Figure 5:
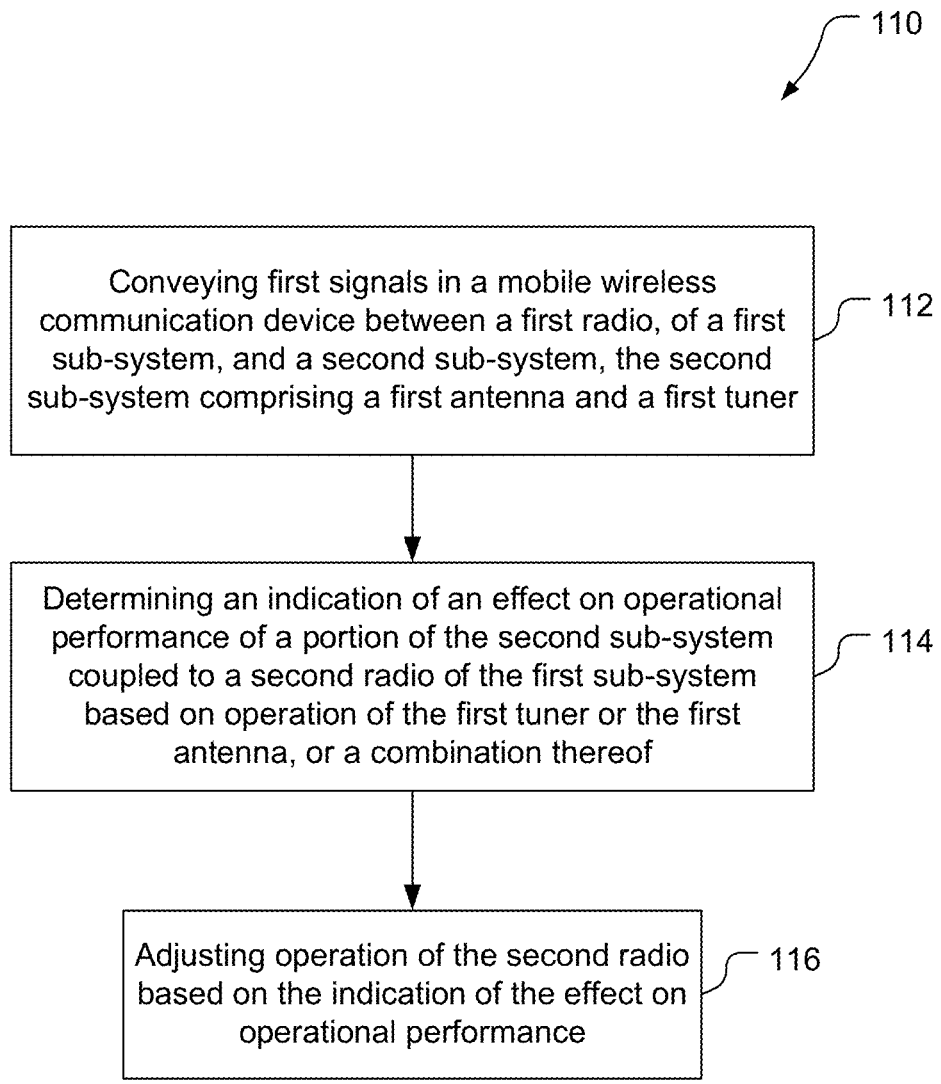
FIG. 5 is a block flow diagram of a method of adjusting operation of a wireless communication device.

Referring to FIG. 5, with further reference to FIGS. 1-4, a method 110 of adjusting operation of a wireless communication device includes the stages shown. The method 110 is, however, an example only and not limiting. The method 110 may be altered, e.g., by having stages added, removed, rearranged, combined, performed concurrently, and/or having one or more single stages split into multiple stages.

At stage 112, the method 110 includes conveying first signals in a wireless communication device between a first radio, of a first sub-system, and a second sub-system, the second sub-system comprising a first antenna and a first tuner. The first radio includes a transceiver or a receiver. As an example of stage 112, SPS signals may be conveyed from the antenna 30 via the tuner 32 to the SPS radio 40. As another example, WWAN signals may be conveyed from the antenna 30 via the tuner 32 to the WWAN radio 42 and/or from the WWAN radio 42 to the antenna 30 via the tuner 32. As yet another example, SPS signals may be conveyed from one of the antennas 70 to the SPS radio 82 via one of the tuners 72 and the RF front end 78. As yet other examples, signals may be conveyed between one or more of the antennas 70 and one or more of the radios 82-85 via one or more of the tuners 72 and the RF front end 78.

At stage 114, the method 110 includes determining an indication of an effect on operational performance of a portion of the second sub-system coupled to a second radio of the first sub-system based on operation of the first tuner or the first antenna, or a combination thereof. The second radio includes a transceiver or a receiver. As an example of stage 114, the controller 36 may determine an operational effect for the SPS radio 40 based on operation of the sub-system 38 for the WWAN radio 42 or vice versa. As another example, the controller 76 may determine an operational effect for one of the radios 82-85 based on operation of the sub-system 81 for one or more of the radios 82-85 other than the radio for which the operational effect is determined. The operational effect may include influences from outside the system 24 or the system 60, e.g., influence of jammers (although parts of the systems 24, 60 may also act as jammers for other parts of the systems 24, 60 and these effects may be determined as well). As yet another example, the controller 76 may determine multiple tuner states each representing a tuner state of one or more of the tuners 72 to determine the operational effect. As yet another example, the determining may comprise determining a quantitative value of a metric of the first sub-system.

At stage 116, the method 110 includes adjusting operation of the second radio based on the indication of the effect on operational performance. For example, the controller 36 may provide the indication of the effect on operational performance to one or more of the radios 40, 42. For example, if the sub-system 38 is set to facilitate operation of one of the radios 40, 42, then the controller 36 may send the effect indication to the other radio of the radios 40, 42. As other examples, the controller 76 may send one or more effect indications to one or more individual radios of the set of radios 74 and/or to one or more combinations of radios of the set of radios 74 or to all of the radios of the set of radios 74. Different radios and/or combinations of radios may receive different indications of effect on operational performance, e.g., if the same operation of the sub-system 81 affects radios differently, e.g., if the operation of the sub-system 81 affects one or more of the radios 82-85 and does not affect one or more other radios of the radios 82-85. The provided effect indication(s) may be used by a radio to adjust operation of the radio, e.g., by changing a mode of operation, an algorithm implemented by the radio, and/or an operating parameter of the radio. The provided effect indication may include an instruction that causes the radio to change operation. Adjusting operation may include, for example, adjusting a noise figure parameter. Adjusting operation may include disabling all or part of a radio, e.g., such that the radio does not process some signals.

The method 110 may include one or more of the following features. Second signals may be conveyed between the second radio and the first antenna with the first and second signals conveyed to or from the first antenna at different feed points of the first antenna. Second signals may be conveyed between a third radio and a second antenna and determining the indication of effect on operational performance may include determining the tuner state of the first tuner and a tuner state of the second tuner. For example, the controller 76 may determine tuner states of combinations of the tuners 72. One or more tuners may be adjusted, e.g., by adjusting one or more characteristics of each of the one or more tuners based on a present use of an antenna system including the tuner(s) and the radios, a location of the antenna system, and/or a reception environment of the antenna system.

Other Considerations

Also, as used herein, "or" as used in a list of items prefaced by "at least one of" or prefaced by "one or more of" indicates a disjunctive list such that, for example, a list of "at least one of A, B, or C," or a list of "one or more of A, B, or C" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Further, an indication that information is sent or transmitted, or a statement of sending or transmitting information, "to" an entity does not require completion of the communication. Such indications or statements include situations where the information is conveyed from a sending entity but does not reach an intended recipient of the information. The intended recipient, even if not actually receiving the information, may still be referred to as a receiving entity, e.g., a receiving execution environment. Further, an entity that is configured to send or transmit information "to" an intended recipient is not required to be configured to complete the delivery of the information to the intended recipient. For example, the entity may provide the information, with an indication of the intended recipient, to another entity that is capable of forwarding the information along with an indication of the intended recipient.

Substantial variations may be made in accordance with specific requirements. For example, customized hardware might also be used, and/or particular elements might be implemented in hardware, software (including portable software, such as applets, etc.) executed by a processor, or both. Further, connection to other computing devices such as network input/output devices may be employed.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional stages or functions not included in the figure. Furthermore, examples of the methods may be implemented by hardware, software, firmware, middleware, microcode, hardware description languages, or any combination thereof. When implemented in software, firmware, middleware, or microcode, the program code or code segments to perform the tasks may be stored in a non-transitory computer-readable medium such as a storage medium. Processors may perform the described tasks.

Components, functional or otherwise, shown in the figures and/or discussed herein as being coupled, connected, or communicating with each other are communicatively coupled. That is, they may be directly or indirectly connected, possibly wirelessly connected, to enable conveyance, including passive conveyance, of signals between them.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

Further, more than one invention may be disclosed.

What is claimed is:

1. A wireless communication system comprising:
a first sub-system comprising a first radio and a second radio, each of the first radio and the second radio comprising a transceiver or a receiver; and
a second sub-system coupled to the first sub-system and comprising:
  a first antenna configured to convey signals;
  a first tuner coupled to the first antenna; and
  a controller coupled to the first tuner, the controller being configured to cause the first tuner to adjust a characteristic of the first tuner;
  wherein the controller or the first tuner, or a combination thereof, is configured to provide, to the first sub-system, an indication of an effect on operational performance of a of the second sub-system, connected to the second radio, due to operation of the second sub-system that comprises the first tuner or the first antenna, or a combination thereof, connected to the first radio;
  wherein the first sub-system is configured to modify operation of the second radio based on the indication of the effect on operational performance.

2. The system of claim 1, wherein the indication of the effect on operational performance is a quantitative value of a metric.

3. The system of claim 2, wherein the metric comprises:
an efficiency of an antenna coupled to the second radio; or
a frequency of parameter change of the first tuner; or
a noise introduced into a portion of the second sub-system connected to the second radio; or
a loss introduced into the portion of the second sub-system connected to the second radio; or
a combination of any plurality thereof.

4. The system of claim 1, wherein to modify operation of the second radio the first sub-system is configured to:
modify a mode of operation of the second radio; or
modify an algorithm implemented by the second radio; or
modify an operating parameter of the second radio; or
a combination of any plurality thereof.

5. The system of claim 4, wherein the second radio comprises a satellite positioning system (SPS) receiver configured to:
adjust a noise figure parameter of the SPS receiver based on the indication of the effect on operational performance; or
disable, based on the indication of the effect on operational performance, processing of signals that are expected not to provide positioning quality above a threshold; or
a combination thereof.

6. The system of claim 1, wherein the indication of the effect on operational performance is a qualitative indication corresponding to operational performance of at least the first tuner or the first antenna, or a combination thereof.

7. The system of claim 1, wherein the controller is configured to cause the first tuner to adjust the characteristic of the first tuner based on:
a present use of the system; or
a location of the system; or
a reception environment of the system; or
a combination of any plurality thereof.

8. A method of adjusting operation of a wireless communication device, the method comprising:
conveying first signals in a wireless communication device between a first radio, of a first sub-system, and a second sub-system, the second sub-system comprising a first antenna and a first tuner;
determining an indication of an effect on operational performance of the second sub-system, connected to a second radio of the first sub-system, due to operation of the second sub-system that comprises the first tuner or the first antenna, or a combination thereof, connected to the first radio; and
adjusting operation of the second radio based on the indication of the effect on operational performance;
wherein the first radio and the second radio each comprise a transceiver or a receiver.

9. The method of claim 8, wherein determining the indication of the effect on the operational performance comprises determining a quantitative value of a metric of the first sub-system.

10. The method of claim 8, wherein adjusting operation of the second radio comprises:

modifying a mode of operation of the second radio; or
modifying an algorithm implemented by the second radio; or
modifying an operating parameter of the second radio; or
a combination of any plurality thereof.

11. The method of claim 10, wherein the second radio comprises a satellite positioning system (SPS) receiver and adjusting operation of the second radio comprises:
adjusting a noise figure parameter of the SPS receiver based on the indication of the effect on operational performance; or
disabling, based on the indication of the effect on operational performance, processing of signals that are expected not to provide positioning quality above a threshold; or
a combination thereof.

12. The method of claim 8, further comprising adjusting a characteristic of the first tuner based on:
a present use of the wireless communication device; or
a location of the wireless communication device; or
a reception environment of the wireless communication device; or
a combination of any plurality thereof.

13. A wireless communication device comprising:
antenna means for transducing signals between electrical signals and wireless signals;
first radio means for processing first signals;
second radio means for processing second signals;
tuning means, coupled to the first radio means, the second radio means, and the antenna means, for providing an adjustable characteristic; and
determining means for determining an indication of an effect on operational performance of at least one of the tuning means or the antenna means, connected to the second radio means, due to operation of at least one of the tuning means or the antenna means, connected to the first radio means;
wherein the second radio means are further for altering processing of the second signals based on the indication of the effect on operational performance.

14. The wireless communication device of claim 13, wherein the determining means are for determining the indication of the effect on the operational performance as a quantitative value of a metric of the antenna means, or the tuning means, or a combination thereof.

15. The wireless communication device of claim 14, wherein the metric comprises:
an efficiency of an antenna of the antenna means; or
a frequency of parameter change of a tuner of the tuning means; or
a noise introduced into at least one of the tuning means or the antenna means, connected to the second radio means; or
a loss introduced into at least one of the tuning means or the antenna means, connected to the second radio means; or
a combination of any plurality thereof.

16. The wireless communication device of claim 13, wherein the second radio means are for altering processing of the second signals by:
modifying a mode of operation of the second radio means; or
modifying an algorithm implemented by the second radio means; or
modifying an operating parameter of the second radio means; or
a combination of any plurality thereof.

17. The wireless communication device of claim 16, wherein the second radio means are for altering processing of the second signals by:
adjusting a noise figure parameter of the second radio means based on the indication of the effect on operational performance; or
disabling, based on the indication of the effect on operational performance, processing of signals that are expected not to provide positioning quality above a threshold; or
a combination thereof.

18. The wireless communication device of claim 13, wherein the tuning means comprise a tuner and wherein the determining means are for determining a tuning state of the tuner.

19. The wireless communication device of claim 13, wherein the tuning means are for adjusting the adjustable characteristic based on:
a present use of the system; or
a location of the system; or
a reception environment of the system; or
a combination of any plurality thereof.

20. A non-transitory, processor-readable storage medium comprising processor-readable instructions for causing a processor of a wireless communication device to:
convey signals in a between a first radio, of a first sub-system, and a second sub-system that comprises an antenna and a tuner;
determine an indication of an effect on operational performance of the second sub-system, connected to a second radio of the first sub-system, due to operation of the second sub-system that comprises the tuner or the antenna, or a combination thereof, connected to the first radio; and
adjust operation of the second radio based on the indication of the effect on operational performance.

21. The storage medium of claim 20, wherein the instructions configured to cause the processor to determine the indication of the effect on operational performance are configured to cause the processor to determine a quantitative value of a metric, wherein the metric comprises:
an efficiency of an antenna coupled to the second radio; or
a frequency of parameter change of the tuner; or
a noise introduced into a portion of the second sub-system connected to the second radio; or
a loss introduced into the portion of the second sub-system connected to the second radio; or
a combination of any plurality thereof.

22. The storage medium of claim 21, wherein the instructions configured to cause the processor to adjust operation of the second radio comprise instructions configured to cause the processor to:
modify a mode of operation of the second radio; or
modify an algorithm implemented by the second radio; or
modify an operating parameter of the second radio; or
a combination of any plurality thereof.

23. The storage medium of claim 22, wherein the instructions configured to cause the processor to adjust operation of the second radio comprise instructions configured to cause the processor to:
adjust a noise figure parameter of the second radio based on the indication of the effect on operational performance; or disable, based on the indication of the effect on operational performance, processing of signals that are expected not to provide positioning quality above a threshold; or a combination thereof.

24. The storage medium of claim 20, further comprising instructions configured to cause the processor to adjust a characteristic of the tuner based on:

a present use of the wireless communication device; or a location of the wireless communication device; or a reception environment of the wireless communication device; or a combination of any plurality thereof.

\* \* \* \* \*